United States Patent [19]
Koyama et al.

[11] Patent Number: 5,898,188
[45] Date of Patent: Apr. 27, 1999

[54] SEMICONDUCTOR DEVICE AND METHOD FOR ITS FABRICATION

[75] Inventors: Jun Koyama; Hideomi Suzawa; Satoshi Teramoto, all of Kanagawa, Japan

[73] Assignee: Semiconductor Energy Laboratory Co., Ltd., Kanagawa, Japan

[21] Appl. No.: 08/877,897

[22] Filed: Jun. 18, 1997

Related U.S. Application Data

[63] Continuation of application No. 08/496,531, Jun. 29, 1995, abandoned.

[30] Foreign Application Priority Data

Jul. 6, 1994 [JP] Japan ................................ 6-177645
Jul. 8, 1994 [JP] Japan ................................ 6-180942

[51] Int. Cl.[6] ........................ H01L 29/04; H01L 29/786
[52] U.S. Cl. ........................ 257/75; 257/65; 257/66; 257/349
[58] Field of Search ................................ 257/65, 66, 75, 257/349, 354, 51

[56] References Cited

U.S. PATENT DOCUMENTS

| | | | |
|---|---|---|---|
| 4,054,895 | 10/1977 | Ham | 257/354 |
| 5,142,344 | 8/1992 | Yamazaki | 257/75 |
| 5,147,826 | 9/1992 | Liu et al. | 437/233 |
| 5,275,851 | 1/1994 | Fonash et al. | 427/578 |
| 5,481,121 | 1/1996 | Zhang et al. | 257/64 |
| 5,508,533 | 4/1996 | Takemura | 257/65 |

OTHER PUBLICATIONS

R. Kakkad et al., "Crystallized Si films by low-temperature rapid thermal annealing of amorphous silicon," *J.Appl. Phys.*, 65(5), Mar. 1, 1989, pp. 2069–2072.

G. Liu et al., "Polycrystalline silicon thin film transistors on Corning 7059 glass substrates using short time, low-temperature processing," *Appl. Phys. Lett.* 62(20), May 17, 1993, pp. 2554–2556.

G. Liu et al., "Selective area crystallization of amorphous silicon films by low-temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

C. Hayzelden et al., "In Situ Transmission Electron Microscopy Studies of Silicide-Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

*Primary Examiner*—Jerome Jackson
*Assistant Examiner*—John F. Guay
*Attorney, Agent, or Firm*—Sixbey, Friedman, Leedom & Ferguson, P.C.; Gerald J. Ferguson, Jr.; Jeffrey L. Costellia

[57] ABSTRACT

The side surfaces of an active layer from which a thin-film transistor is constructed are annealed by laser light irradiation. Defects which occur during patterning concentrate at the side surfaces of the active layer, and due to the movement of carriers which results from these defects, an OFF current is generated. Thus, by improving the crystallinity of the side surfaces of the active layer and thereby reducing the number of defects it is possible to reduce the OFF current.

20 Claims, 9 Drawing Sheets

LASER LIGHT IRRADIATION STAGE

IMPURITY ION IMPLANTATION AND LASER LIGHT IRRADIATION

SEMICONDUCTOR DEVICE AND METHOD FOR ITS FABRICATION

This application is a Continuation of Ser. No. 08/496,531, filed Jun. 29, 1995, now abandoned.

BACKGROUND OF THE INVENTION

1. Field of the Invention

The invention disclosed in the present specification relates to the construction of a thin-film transistor and a method for its fabrication.

2. Description of the Related Art

Thin-film transistors (generally termed TFTs) which employ thin-film semiconductors formed on a substrate which has an insulating surface, such as a glass substrate, are known. These thin-film transistors are used in various types of integrated circuit. There are in particular known examples in which they are arranged at each pixel portion of an active matrix-type liquid crystal display device, and are used for switching the pitch element.

Known types of thin-film semiconductor include amorphous silicon films and crystalline silicon films. Amorphous silicon films have the feature that they have excellent productivity since film formation is simple, but there is the problem that their electrical properties are low, and the properties of the resulting thin-film transistors are low. On the other hand, crystalline silicon films have the feature that thin-film transistors which have high properties can be obtained. However, since at present it is not possible to obtain monocrystal silicon films, the resulting films inevitably have a multi-crystalline structure or a fine crystalline structure (the general term for these is crystalline silicon films).

FIG. 2(A) shows an example of a typical thin-film transistor. FIG. 2 shows that a silicon oxide film 202 forms a surface on a glass substrate 201, and that on this surface there is an active layer which consists of an n-type source region 203, an effectively intrinsic (I-type) channel-forming region 204, and an n-type drain region 205, and that there are further a gate insulating film 206, a gate electrode 207, an inter-layer insulating film 208, a source electrode 209 and a drain electrode 210.

In thin-film transistors which employ such crystalline silicon films, the presence of an OFF current (also known as a leak current) is a significant problem. The OFF current is a phenomenon whereby when the n-channel type thin-film transistor shown in FIG. 2, for example, is in the OFF state, if a negative voltage is applied to the gate electrode 207, then a current flows between the channel-forming region 204 and the drain region 205. With the n-channel type thin-film transistor in the OFF state, if a negative voltage is applied to the gate electrode 207 then the portion of the channel-forming region 204 which is in contact with the gate insulating film 206 becomes a p-type region. Thus if the thin-film semiconductor which constitutes the active layer (in which the source/drain regions and channel-forming regions are formed) is a monocrystal, then a pn junction forms between the source and the drain, and no large current flows between the source and the drain. However, if the thin-film semiconductor constituting the active layer has a multi-crystalline structure or a fine-crystalline structure then movement of carriers will inevitably occur across crystal grain boundaries due to the high electric field which forms between the source region or the drain region and the channel-forming region. As a result, the OFF current is relatively large.

A known technique which is used to reduce the above-mentioned OFF current is to adopt an LDD structure or an offset gate structure. These structures aim to reduce the OFF current by arranging that electric fields are not concentrated at the boundaries between the source region or the drain region and the channel-forming region, or in the vicinity thereof.

According to the research of the inventors, the above-mentioned LDD structure and offset gate structure are certainly effective in reducing the OFF current, but it was discovered that it is not possible to obtain a substantially large improvement. Thus the dependence of the OFF current on various parameters was investigated by varying the various parameters. As a result it was discovered that there is little variation in the OFF current even if the width of the active layer is varied. FIG. 2(B) shows the approximate form of the active layer. In FIG. 2(B), 21 is a source region, 22 is a channel-forming region and 23 is a drain region. Further, W is the width of the active layer and L is the length of the active layer.

Firstly, when the width W of the active layer was varied, no noticeable variation in the value of the OFF current was seen. If carrier movement, which is the cause of the OFF current, were occurring over the whole cross-section of the active layer then one would expect to see a variation in the value of the OFF current as the width W of the active layer is varied. This is because by varying the width W of the active layer, the path area (the cross-sectional area of the active layer) for the carriers, which cause the OFF current, varies.

However, when the thickness of the active layer was varied a noticeable variation in the value of the OFF current was seen, depending on this variation. It was thus confirmed that the OFF current is reduced by reducing the thickness of the active layer.

The abovementioned experimental fact results from the carrier movement, which is the cause of the OFF current, occurring mainly at the side face 24 of the active layer. Thus, if carrier movement, which is the cause of the OFF current, occurs mainly at the side face 24 of the active layer, then varying the width of the active layer will have almost no effect on the movement of carriers, and there will therefore be little variation in the value of the OFF current. On the other hand, reducing the thickness of the active layer reduces the carrier path, and therefore reduces the OFF current.

The reason that the carriers move via the side surface of the active layer results from the fact that a large number of traps concentrate at the side surface of the junction between the channel-forming region and the source region or the drain region. Traps concentrate at the side surface of the active layer for the following reason. In general, in order to form an active layer, a method employing dry etching, such as the RIE method, is used. In this case there is noticeable plasma damage at the peripheral edges and peripheral side faces of the active layer. Thus defects form in a concentrated manner at the side faces of the etched active layer. In other words traps concentrate at the side faces of the active layer.

In order to eliminate or reduce the traps which are present at the side faces of the active layer it is necessary to reduce the trap concentration by reducing the defects at the side face of the active layer after the patterning stage in which the active layer is formed (patterning by dry etching). In other words it is necessary to perform some type of annealing at the side surfaces.

The invention given in the present specification was performed by passing through the stages mentioned above.

SUMMARY OF THE INVENTION

The object of the present invention is to obtain a thin-film transistor which has a small OFF current.

One of the inventions disclosed in the present specification has the characteristic that crystallinity at the peripheral edges of the active layer is particularly increased.

In the abovementioned construction, the construction shown by 106, 108 and 107 in FIG. 1 can be cited as an active layer in which are formed a source region, a drain region and a channel-forming region. In FIG. 1, 106 and 108 are a source region and a drain region, and 107 is a channel-forming region. Further, in the construction shown in FIG. 1, the source/drain regions and the channel-forming region are formed in an active layer (a semiconductor layer indicated by 103), but a lightly doped region or an offset gate region, or the like, may also be formed in the active layer.

Further, the construction of another invention has the characteristic feature that it has an active layer in which are formed a source region, a drain region and a channel-forming region, and that the crystallinity at the side surfaces of the abovementioned active layer in at least the boundary between the drain region and the channel-forming region and/or in the vicinity thereof is particularly increased.

The constitution of another invention has the characteristic that it comprises a stage in which an amorphous silicon film is formed on a substrate which has an insulating surface, a stage in which the abovementioned amorphous silicon film is crystallized to form a crystalline silicon film, a stage in which the abovementioned crystalline silicon film is patterned to form an active layer, and a stage in which the abovementioned active layer is irradiated by laser light or strong light.

In the abovementioned constructions, examples which can be cited of substrates which have an insulating surface include glass substrates, quartz substrates, glass substrates on which an insulating film is formed, semiconductor substrates on which an insulating film is formed, or conducting substrates on which an insulating film is formed.

Methods for crystallizing the silicon film include methods employing heat, methods employing irradiation of laser light or strong light, and methods which combine heat with irradiation by laser light or strong light. Further, crystallization methods which employ metal elements to promote crystallization of the amorphous silicon film may also be adopted. In this case, one type or a plurality of types of elements chosen from Fe, Co, Ni, Cu, Ru, Rh, Pd, Ag, Os, Ir, Pt and Au can be used as the metal element(s). Particularly noticeable effects can be obtained if Ni (nickel) is used. Specifically, a crystalline silicon film can be obtained by heat treating at 550° C. (conventionally 600° C. or more) for 4 hours (conventionally 12 hours or more). Further, combining irradiation with laser light or strong light with thermal crystallization using these metal elements is advantageous.

In order to introduce the metal elements into the amorphous silicon film a thin film of the metal elements, or a thin film containing the metal elements should be formed on the surface of the amorphous silicon film.

The concentration of metal elements within the active layer is preferably between $1 \times 10^{15}$ cm$^{-3}$ and $1 \times 10^{19}$ cm$^{-3}$. If the concentration is lower than this range then the crystallization promoting effects are small, and if the concentration is larger than this range, then the characteristics of the semiconductor will exhibit the behavior of a metal, and the semiconductor will be unsuitable for use as a semiconductor element.

The reason that irradiation with laser light or strong light is performed after the active layer has been formed by patterning, is in order to reduce the number of defects at the peripheral edges of the active layer, and in particular the side faces of the active layer, by subjecting the peripheral edges of the active layer to an annealing treatment.

The irradiation with laser light or strong light is advantageous if it is concentrated selectively at the peripheral edges of the active layer. Further, it is extremely advantageous if the laser light is irradiated at the side surfaces of the active layer.

Another invention disclosed in the present specification has the characteristic that it comprises a stage in which an amorphous silicon film is formed on a substrate which has an insulating surface, a stage in which the abovementioned amorphous silicon film is crystallized to form a crystalline silicon film, a stage in which the abovementioned crystalline silicon film is patterned to form an active layer, a stage in which the abovementioned active layer is irradiated with laser light or strong light, and a stage in which at least part of the side surfaces of the abovementioned active layer is impregnated with an impurity which imparts a conductor type which is the opposite of the source/drain regions.

The stage in which laser light or strong light are irradiated, and the stage in which at least part of the side surfaces of the active layer is impregnated with an impurity which imparts a conductor type which is the opposite of the source/drain electrodes may be performed in reverse order.

The region which is impregnated with an impurity which imparts a conductor type which is the opposite of the source/drain regions must be at least the side surfaces of the active layer at the boundary between the channel-forming region and the source/drain regions.

According to the present invention which has the abovementioned configuration, defects due to plasma damage or damage during etching are formed in a concentrated manner at the side surfaces of the active layer which is formed by patterning. In other words defects concentrate at the side surfaces of the active layer. Thus by irradiating with laser light or strong light after the active layer has been formed, it is possible to reduce the number of defects which were formed at the side surfaces when the active layer was formed. In particular, by arranging that the side surfaces of the active layer are irradiated with laser light it is possible to reduce effectively the number of defects at the side surfaces of the active layer.

Thus, by reducing the number of defects at the side surfaces of the active layer by irradiating with laser light or strong light it is possible to reduce the concentration of traps at the side surfaces of the active layer, and it is possible to reduce the number of carriers which move via the traps at the side surfaces of the active layer. By this means it is possible to achieve a thin-film transistor which has a small OFF current.

Further, by making the peripheral edges of the active layer have a conductor type which is the opposite of the source/drain regions it is possible to form a pn junction between the channel-forming region and the source/drain regions at the side surfaces of the active layer during the OFF operation, and it is thus possible to increase the insulation between the source and the drain.

DETAILED DESCRIPTION OF THE PREFERRED EMBODIMENTS

Embodiment 1

Figure 1A:
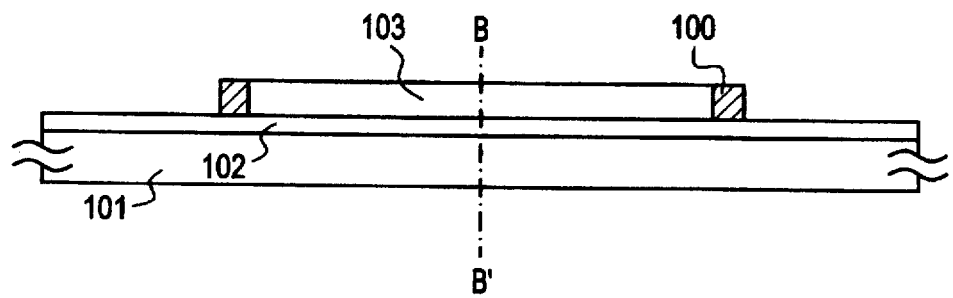
FIGS. 1A, B, and C diagrams showing the fabrication stages of a thin-film transistor indicated in an embodiment.

FIG. 1 shows an example of a thin-film transistor indicating the present embodiment. Firstly, a silicon oxide film 102 is formed to a thickness of 2000 Å on a glass substrate 101 as a base film, using the sputtering method. An amorphous silicon film is then formed to a thickness of 1000 Å by the plasma CVD method or the reduced pressure thermal CVD method. A crystalline silicon film is obtained by performing heat treatment. Performing irradiation with laser light after this heat treatment has an extremely great effect in increasing the crystallinity of the resulting crystalline film. Patterning is then performed by etching using the RIE method, thereby forming an active layer such as is shown by 103 in FIG. 1(A). In this state, the region indicated by 100 is subjected to plasma damage. In particular defects form in a concentrated manner at the side surfaces of the active layer.

FIG. 3 shows a cross section through B–B' in FIG. 1(A). (A) and (B) shown in FIG. 3 indicate the laser light irradiation method described, below. Further, FIG. 1(A) shows the cross section through A–A' in FIG. 3. As shown in FIG. 1 and FIG. 3, the region which is subjected to plasma damage, indicated by 100, extends over the entire peripheral side surface of the active layer.

Here, by performing laser light irradiation it is possible to anneal the plasma damage at the side faces of the above-mentioned active layer indicated by 100. The crystallinity of the entire active layer is, of course, also improved. A KrF excimer laser or an XeCl excimer laser can be used as the laser light. It is advantageous to heat the specimen to a temperature of between 200 and 500° C. at the same time as performing the laser light irradiation. This is because the fusing period of the silicon surface which accompanies irradiation with laser light is extended by combining with heating, and thus the annealing effects of the laser light irradiation are increased.

Further, strong light such as infra-red light may also be used instead of laser light. Further, performing heat treatment after the laser light irradiation is advantageous in that it reduces defects in the active layer.

Figure 3A:
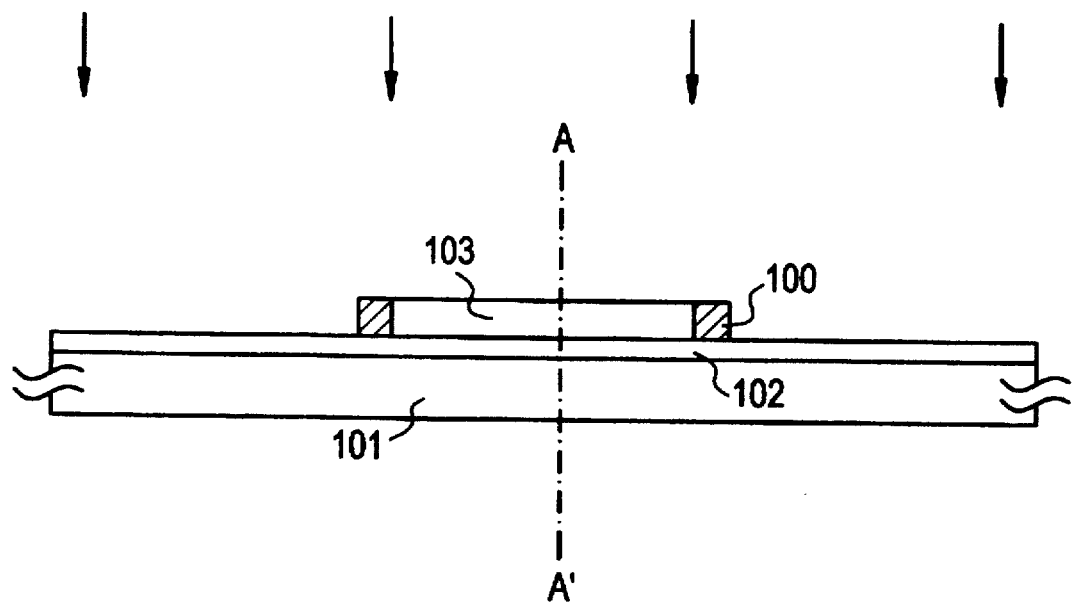
FIGS. 3A and B are diagrams showing the method whereby the active layer is subjected to irradiation with laser light.

Methods for performing the laser light irradiation include the two methods shown in FIGS. 3(A) and (B). The method shown in (A) is one in which irradiation is performed from above over the whole surface, and this is the most general method, and is excellent in terms of productivity and controllability. In this method energy concentrates at the peripheral edges of the active layer, and therefore crystallinity at the side faces of the active layer can be particularly increased. In other words the crystallinity at the side surfaces of the active layer can be made particularly high in relation to the whole of the active layer.

A method shown in (B) the laser light is irradiated from a diagonal direction, and it is a method whereby laser light is irradiated positively at the side surfaces of the active layer. If this method is adopted then it is possible for the annealing effect with respect to the side surfaces of the active layer to be extremely high. In order to perform laser light irradiation from a diagonal direction as shown in (B), laser light should be irradiated with the substrate tilted.

Figure 1B:
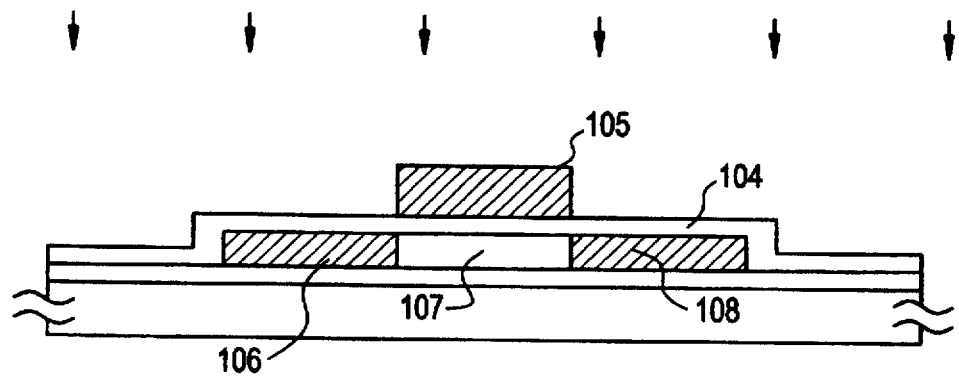

It is thus possible to eliminate or greatly reduce the number of defects at the peripheral side faces of the active layer. Next, as shown in FIG. 1(B), a silicon oxide film 104 which functions as a gate insulating film is formed to a thickness of 1000 Å by the plasma CVD method. A known covering whose main component is silicon, which has been doped with a high concentration of phosphorus is then formed and patterned, thereby forming a gate electrode 105. Phosphorus ions are then implanted in order to form source-drain regions. Here, phosphorus ions are implanted in order to form to form an n-channel type thin-film transistor, but a p-channel type thin-film transistor may be obtained by implanting boron ions.

A source region 106 and a drain region 108 are formed in this stage in a self-aligning manner. Also, a channel-forming region 107 is formed at the same time. Then irradiation is performed with laser light, activating the source region 106 and the drain region 108. In this stage it is also possible to irradiate with strong light instead of irradiating with laser light. Further, the source/drain regions may also be activated firmly.

Figure 1C:
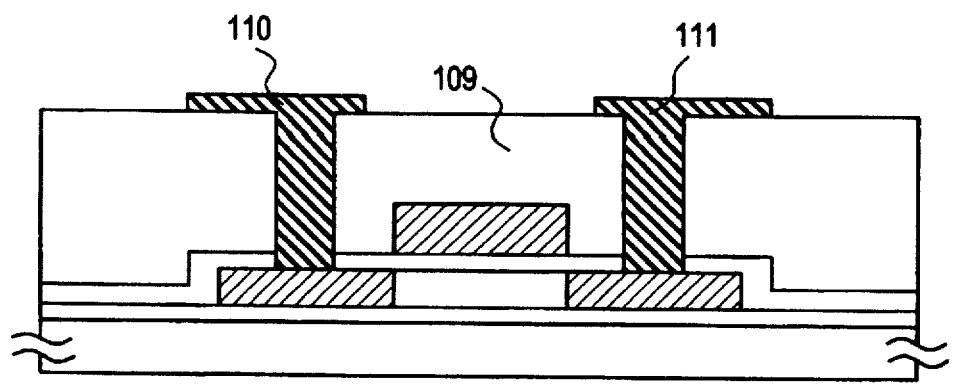
Figure 2A:
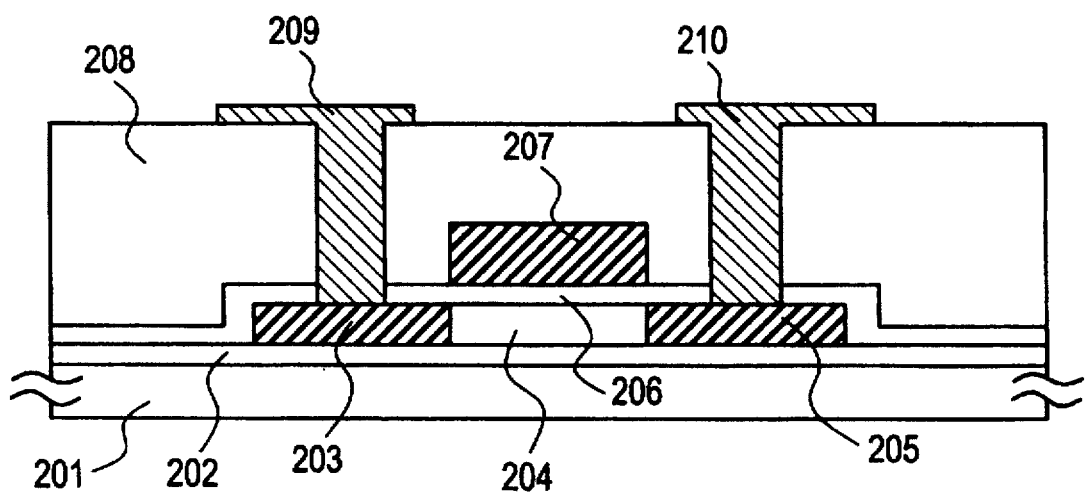
FIGS. 2A and 2B are diagrams showing the approximate construction of a general thin-film transistor.
Figure 2B:
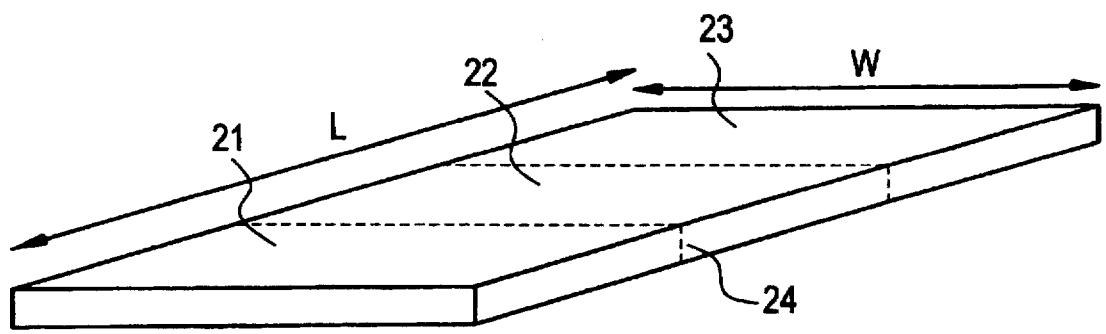

A silicon oxide film 109 is then formed as an inter-layer insulating film to a thickness of 7000 Å by the plasma CVD method, a hole-making process is then performed and a source electrode 110 and a drain electrode 111 are formed. The thin-film transistor shown in FIG. 1(C) is completed by performing heat treatment in the hydrogen atmosphere at 350° C. for one hour.

Embodiment 2

The present embodiment is an example in which the invention disclosed in the present specification is applied to a thin-film transistor which is provided with an offset gate construction and a lightly doped region. FIG. 4 shows the fabrication stages of the thin-film transistor indicated by the present embodiment.

Firstly, a silicon oxide film is formed on a glass substrate 401 as a base film 402, to a thickness of 2000 Å by the plasma CVD method or the sputtering method. An amorphous silicon film 403 is then formed to a thickness of 1000 Å by the plasma CVD method or the reduced-pressure thermal CVD method. Nickel is then introduced into the amorphous silicon as a metal element in order to promote crystallization of the amorphous silicon film. Here, introduction of the nickel into the amorphous silicon film 403 is performed using a nickel acetate solution. To elaborate, by applying the nickel acetate solution to the amorphous silicon film 403 using a spinner, the nickel element comes into contact with and is maintained on the surface of the amorphous silicon film 403. Here, the nickel introduction dosage is controlled such that the concentration of nickel within the active layer is between $1\times10^{15}$ cm$^{-3}$ and $1\times10^{19}$ cm$^{-3}$. Here, the amount of nickel which is introduced should be controlled by controlling the nickel concentration in the nickel acetate solution. Further, plasma staging or the sputtering method, or further the plasma CVD method or the ion implantation method may also be used as methods of introducing nickel.

The amorphous silicon film is then converted into a crystalline silicon film by heating or laser light irradiation, or by a combination of heating and of laser light irradiation. Here, a crystalline silicon film is obtained by heat treatment for 4 hours at 550° C. in a nitrogen atmosphere. (FIG. 4(A)).

An active layer 404 of the thin-film transistor is then formed by patterning. Here, the peripheral edges 420 of the active layer 404 are formed with a tapered shape by performing isotropic etching. The details of this stage will be described using FIG. 8. Firstly, an extremely thin oxide film is formed on the upper surface of the silicon film 403. Here, an oxide film 803 is formed by performing heat treatment for one hour at 550° C. in an oxygen atmosphere. This oxide film 803 prevents a resist which is formed later from coming into direct contact with the silicon film 403, and is necessary in order to prevent organic substances and the like in the resist diffusing into the silicon film.

Figure 9:
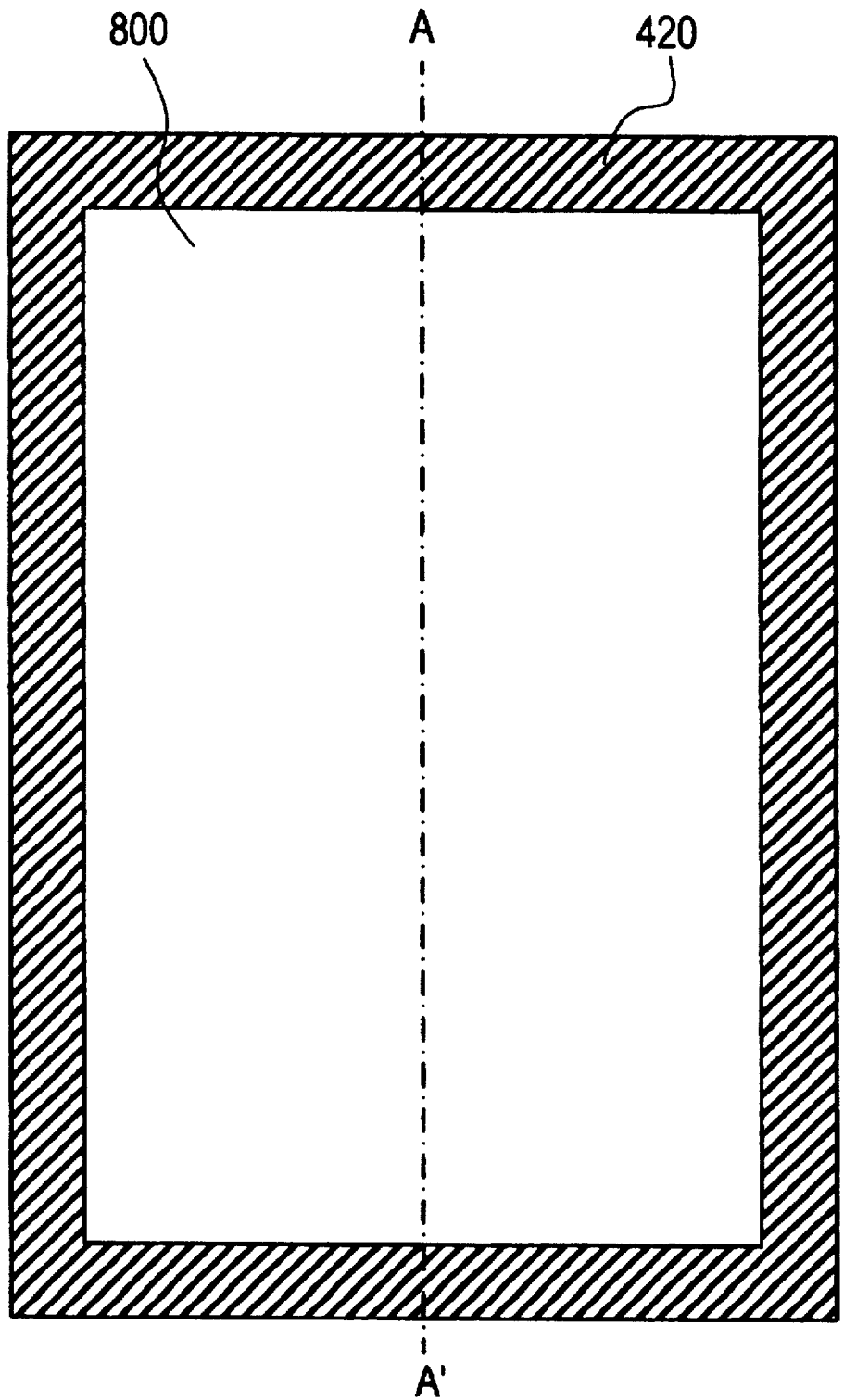
FIG. 9 is a diagram showing a top surface view of FIG. 8(C).

A resist mask 800 is then formed. Etching then proceeds as indicated by the dotted lines 802 and 801 in FIG. 8(B), by performing isotropic plasma etching. As a result it is possible to obtain an active layer 404 whose periphery is formed with a tapered shape, as shown by 420. In this state, impurity ions which impart a conductor type which is opposite to the conductor type constituting the source/drain regions are implanted at a dosage of between $1\times10^{12}$ and $1\times10^{14}$ cm$^{-2}$. the implantation of the impurity ions is performed in the regions of the active layer which are formed with a tapered shape as indicated by the diagonal lines in FIG. 8(C), due to the presence of the remaining resist mask 800. This situation is shown in FIG. 9. FIG. 9 is a view seen from the top surface of FIG. 8(C). Further, the cross section through A–A' in FIG. 9 corresponds to FIG. 8(C). In this case an impurity which imparts a conductor type which is the reverse of the source/drain regions is doped over the entire periphery of the active layer. Here, boron ions are implanted at a dosage of between $1\times10^{12}$ and $1\times10^{14}$ cm$^{-2}$. The significance of this stage is that it is not necessary to enhance the mask further since it is possible to perform the process in a self-aligning manner using the remaining resist mask 800. The resist mask 800 and the oxide from 803 are then removed to obtain the state shown in FIG. 8(D). The state shown in FIG. 8(D) corresponds to FIG. 4(B).

By forming the portion indicated by 420 with a tapered shape it is possible to have a construction such that steps do not form in the wiring formed on the active layer 404. However, plasma damage occurs in a concentrated manner at the peripheral edges and peripheral side surfaces of the active layer indicated by 420, and therefore there is a large concentration of traps.

Figure 3B:
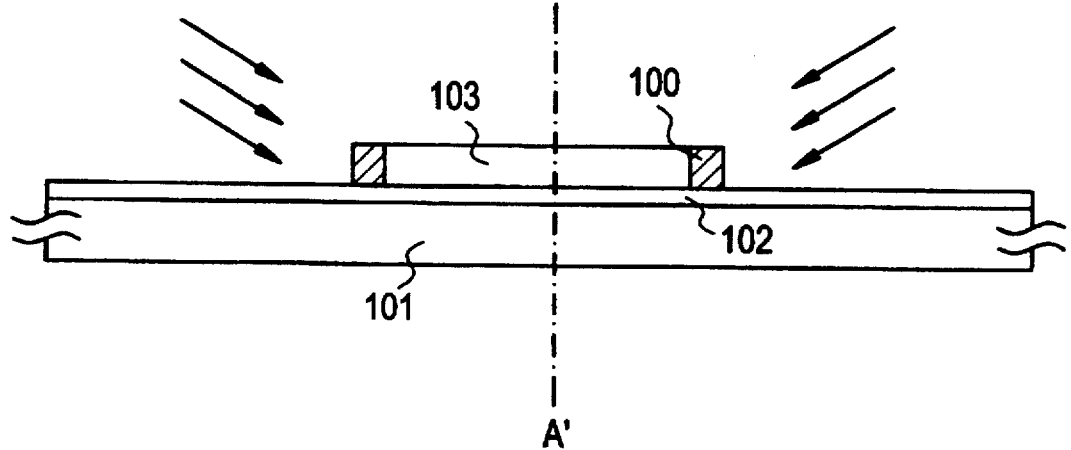
Figure 4A:
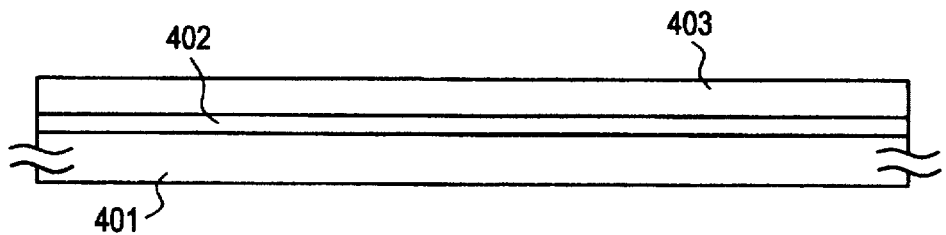
FIGS. 4A, B, C, D, and E are diagrams showing the fabrication of a thin-film transistor indicated in an embodiment.
Figure 4B:
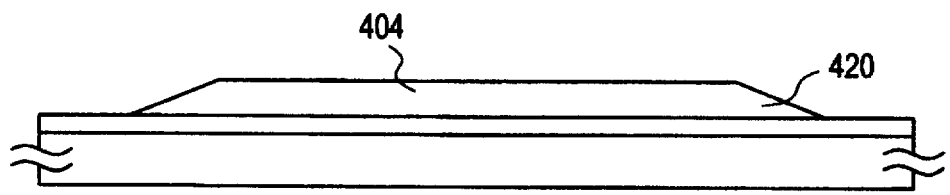
Figure 4C:
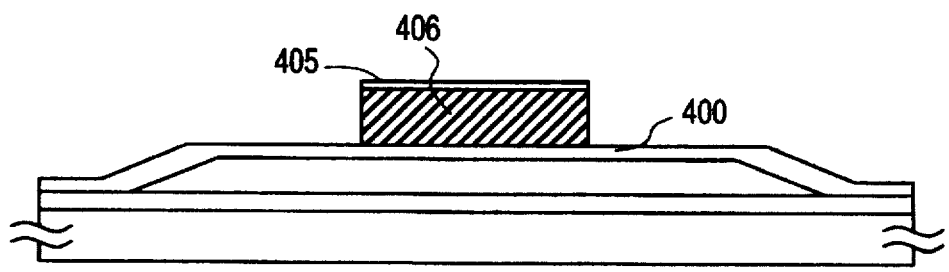
Figure 4D:
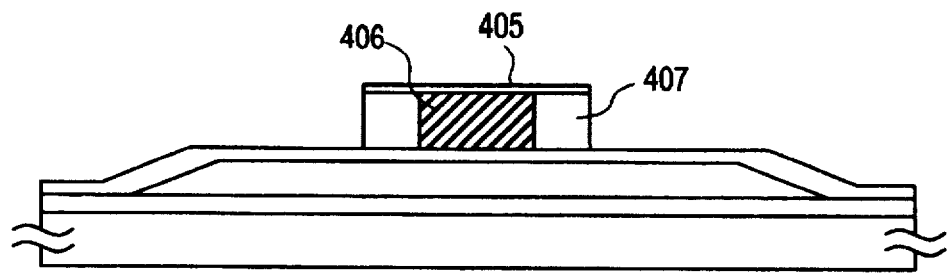
Figure 4E:
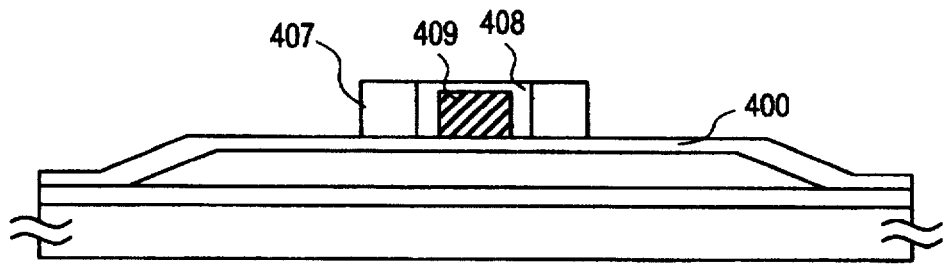

Thus the traps at the peripheral side faces of the active layer are reduced by irradiation with laser light. The laser light irradiation which is performed here may be performed over the whole surface of the active layer as shown in FIG. 3(A), or it may be performed diagonally with respect to the edges of the active layer, as shown in FIG. 3(B).

A silicon oxide film 400 is then formed by the plasma CVD method or the reduced-pressure thermal CVD method. An aluminum film with a thickness of 6000 Å is then formed by the electron beam vacuum evaporation method or the sputtering method. 1 wt % of silicon or 0.1 wt % of scandium is contained in the aluminum film. An anodic oxide film 405 of between approximately 50 and 100 Å is then formed on the surface of the aluminum film. This anodic oxide film is formed by performing anodic oxidation in an ethylene glycol solution containing between 3 and 10% of tartaric acid, with the aluminum film as the anode. Here, the applied voltage is between 100 and 200 V, for example 150 V, and a fine barrier-type anodic oxide film is formed.

A mask is then formed using a photoresist, and an aluminum film 406 which has been patterned by the dry etching method is formed. The fine oxide layer 405 which was formed previously by the anodic oxidation is present on the aluminum film. (FIG. 4(C)).

A porous oxide layer 407 is then formed to a thickness of between 3000 Å and 1 μm, for example 5000 Å, by performing anodic oxidation in a solution of citric acid or nitric acid of between 3 and 20%. Here, the anodic oxidation is performed in a 10% solution of nitric acid at 30° C. by applying a voltage of 10 V for 25 minutes. (FIG. 4(D)).

The fine oxide layer 405 is then removed, and anodic oxidation is again performed in an ethylene glycol solution containing tartaric acid, to form a fine oxide layer 408. The thickness of the oxide film 408 is 2000 Å. Further, in this anodic oxidation stage a gate electrode 409 whose main component is aluminum is fixed. (FIG. 4(E)).

The silicon oxide film 400 is then removed by the dry etching method using the oxide 407 as a mask. Thus the state shown in FIG. 5(A) is obtained.

Figure 5A:
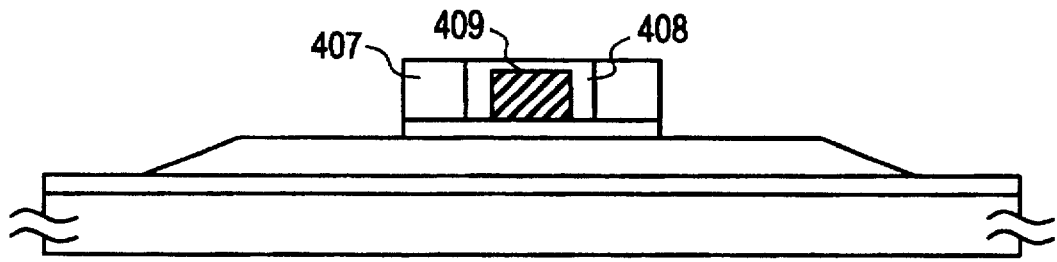
FIGS. 5A, B, and C are diagrams showing the fabrication of a thin-film transistor indicated in an embodiment.
Figure 5B:
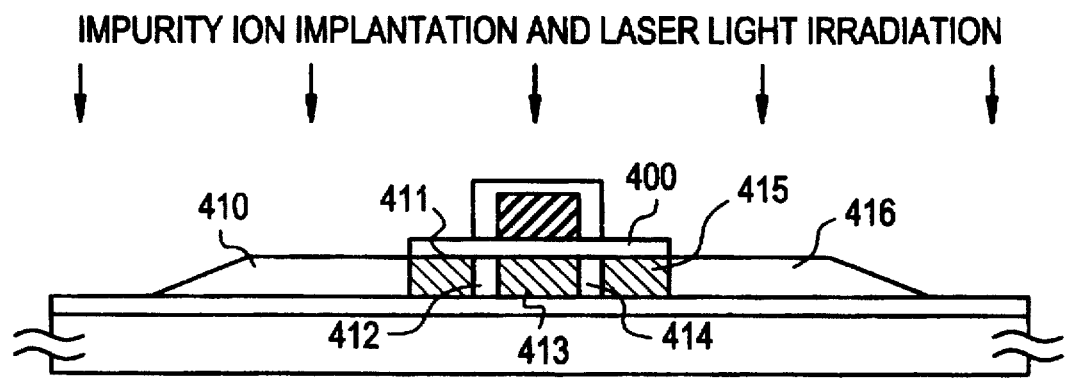

Having obtained the state shown in FIG. 5(A), the porous oxide layer 407 is selectively etched using a mixture of phosphoric acid, acetic acid and nitric acid. Source/drain regions are then formed by performing impurity ion implantation. Here, phosphorus ions are implanted in order to fabricate the n-channel type thin-film transistor. Here, phosphorus ion implantation is performed with a dosage of between $5\times10^{14}$ and $5\times10^{15}$ cm$^{-2}$.

In this stage the source region 410 and the drain region 416 are formed in a self-aligning manner. Further, lightly doped regions 411 and 415, and offset gate regions 412 and 414 are formed at the same time. The lightly doped regions 411 and 415 are formed by ion implantation being performed with lower concentration than in the source region 410 and the drain region 416 since part of the implanted ions is shielded by the remaining silicon oxide film 400. Further, in the offset gate regions 412 and 414 the oxide layer 408 at the periphery of the gate electrode 409 acts as a mask and thus impurity ions are not implanted. (FIG. 5(D)).

A silicon oxide film 417 is then formed as an inter-layer insulating film to a thickness of 6000 Å by the plasma CVD method. A hole-making process is then performed and a source electrode 418 and a drain electrode 419 are formed. Here, the side faces at the edges of the active layer are formed with a tapered shape, and it is therefore possible to have a construction in which steps do not occur in the electrode wiring which is formed on the active layer. To elaborate, since the side faces at the periphery of the active layer indicated by 420 are formed with a tapered shape, various electrode wires which are formed above this are formed with smooth angles, and thus a construction without steps can be achieved. Further, since the regions which are formed with a tapered shape have the opposite conductor type to the source/drain regions, a PN junction forms during the OFF operation between the channel-forming region at the side surfaces of the active layer, and the source/drain regions, and it is possible to increase the insulation between the source and the drain. It is therefore possible to reduce the OFF current.

Figure 5C:
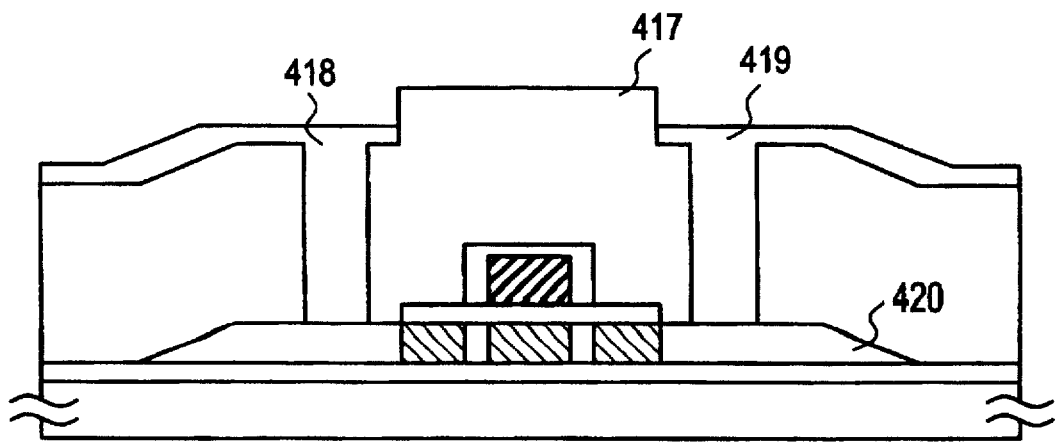
Figure 6:
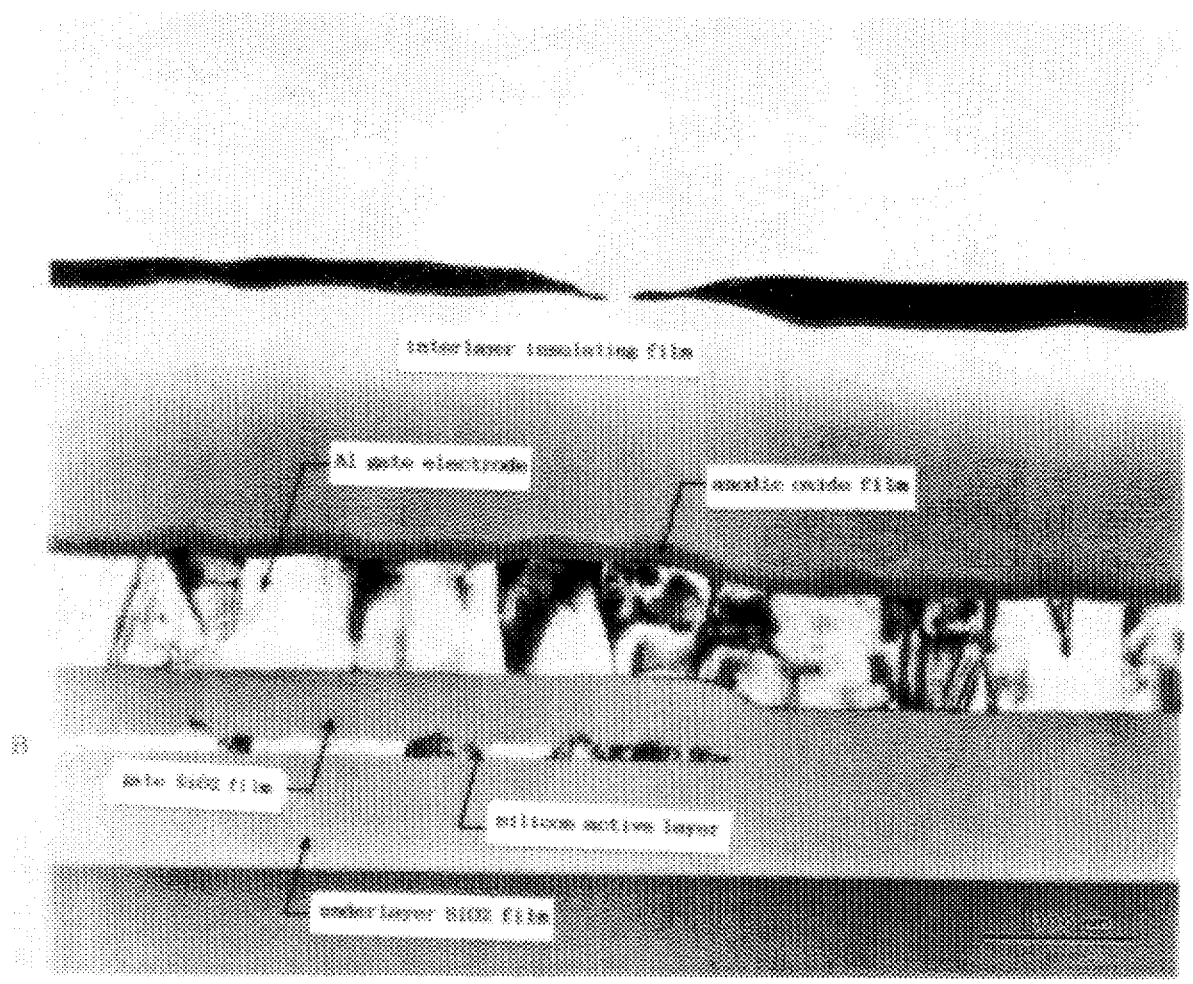
FIG. 6 is a photograph showing a thin film from which a thin-film transistor is constructed.
Figure 7:
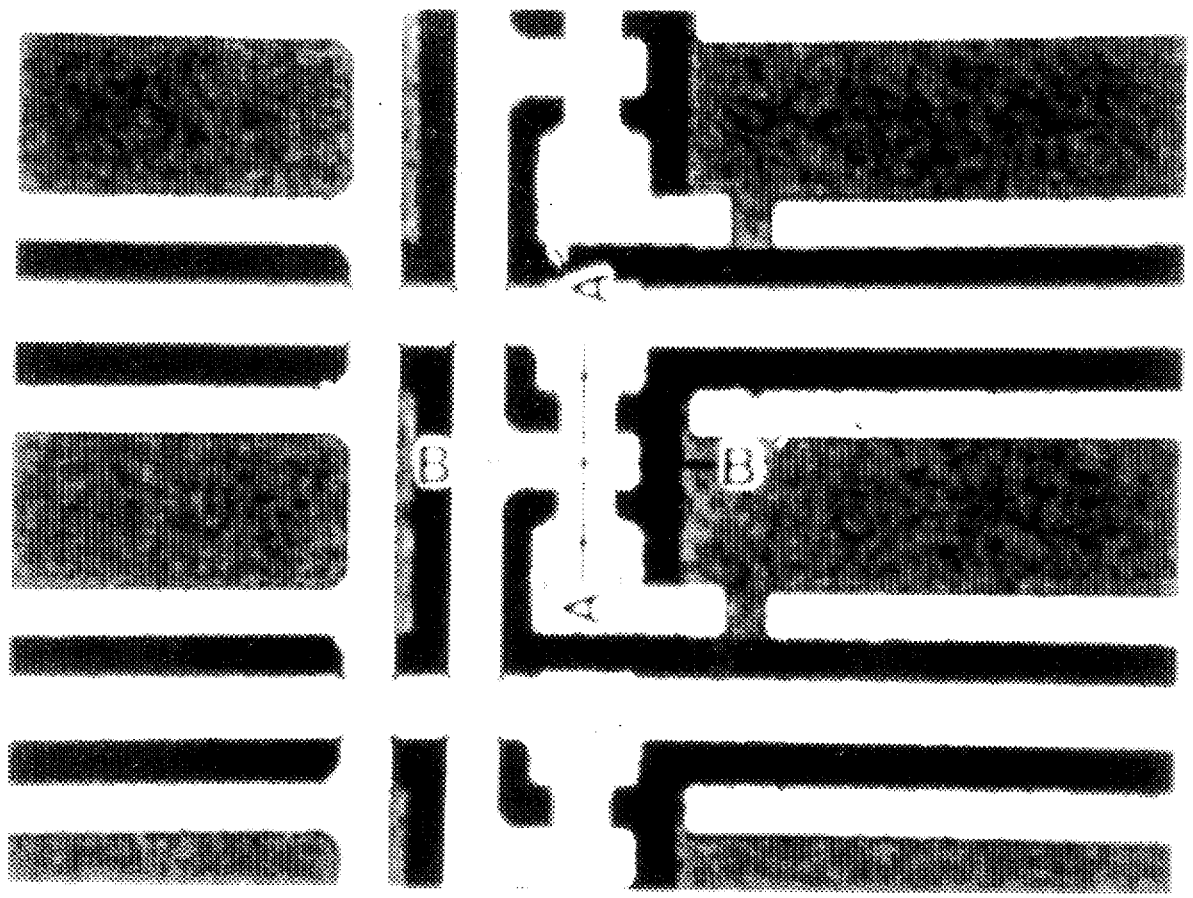
FIG. 7 is a photograph showing a fine pattern (thin-film transistor) formed on a substrate.
Figure 8A:
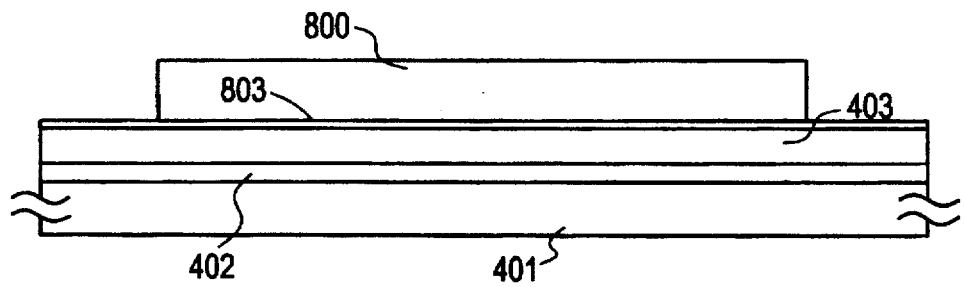
FIGS. 8A, B, C and D are diagrams showing a stage in which an active layer is formed.
Figure 8B:
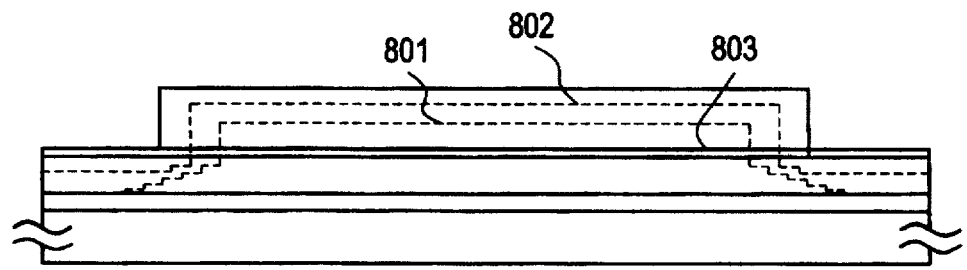
Figure 8C:
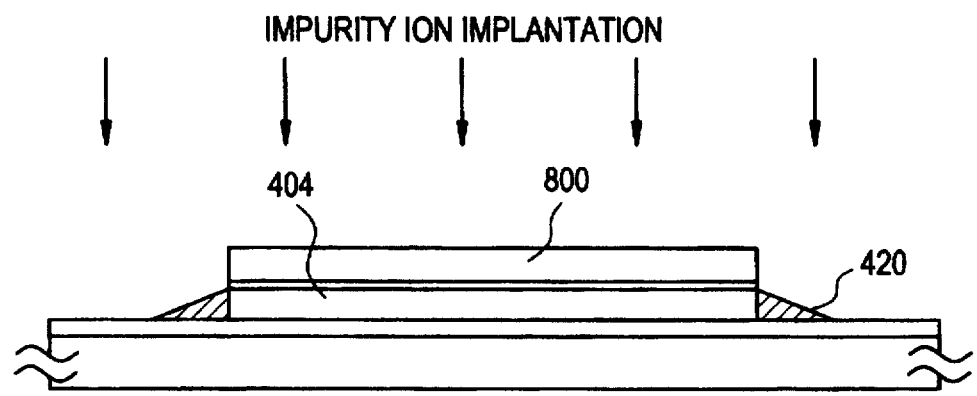
Figure 8D:
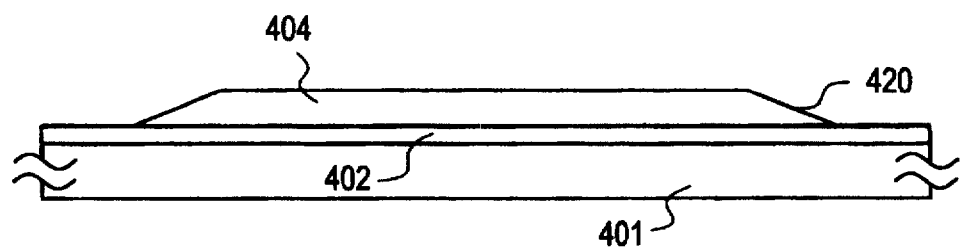

FIG. 6 shows a photograph of a cross section of a completed thin-film transistor. FIG. 6 shows the thin-film active layer and its edges which are formed with a tapered shape. Further, FIG. 7 shows a photograph taken from the top surface of this thin-film transistor. The photograph shown in FIG. 7 shows the fine pattern formed on the substrate. The cross section taken through A–A' in FIG. 7 corresponds to FIG. 5(C), and the cross section taken through B–B' in FIG. 7 corresponds to FIG. 6.

Finally, hydrogenation within the active layer is performed by carrying out heat treatment at 350° C. in a hydrogen atmosphere at normal pressure, thereby completing the thin-film transistor.

As described above, the present invention increases in particular the crystallinity at the side surfaces of the active layer and it is therefore possible to obtain a thin-film transistor which has a low OFF current.

What is claimed is:

1. A semiconductor device comprising an active layer including a channel region wherein crystallinity at peripheral edges of said active layer, at least, including edges of the entire channel region of the semiconductor device is selectively increased as compared with other portions of said active layer.

2. The device of claim 1 wherein whole of the active layer is crystalline.

3. The device of claim 1 wherein whole of the active layer is crystalline, and a metallic element which promotes crystallization is contained in the active layer at a concentration of between $1 \times 10^{15}$ cm$^{-3}$ and $1 \times 10^{19}$ cm$^{-3}$.

4. A semiconductor device comprising an active layer in which are formed a source region, a drain region and a channel-forming region, wherein said active layer includes side surfaces extending peripherally around said active layer and encompassing the source region, drain region and channel-forming region; and wherein crystallinity of said active layer is selectively increased at said side surfaces of the active layer, at least in said side surfaces encompassing the entire channel region and at boundary between the drain region and the channel-forming region, as compared with other portions of the active layer.

5. The device of claim 4 wherein whole of the active layer is crystalline.

6. The device of claim 4 wherein whole of the active layer is crystalline, and a metallic element which promotes crystallization is contained in the active layer at a concentration of between $1 \times 10^{15}$ cm$^{-3}$ and $1 \times 10^{19}$ cm$^{-3}$.

7. A device according to claim 1 wherein said active layer is formed on or over a substrate, said substrate being selected from the group consisting of quartz, glass and an insulating film formed on a semiconductor or a conductor.

8. A device according to claim 1 wherein said active layer has a tapered shape.

9. A device according to claim 4 wherein said active layer is formed on or over a substrate, said substrate being selected from the group consisting of quartz, glass and an insulating film formed on a semiconductor or a conductor.

10. A device according to claim 4 wherein said active layer has a tapered shape.

11. A semiconductor device comprising:

a substrate having an insulating surface;

a crystalline semiconductor island formed on said insulating surface, said island having opposed side surfaces;

a pair of impurity regions formed in said crystalline semiconductor island;

a channel region formed in said crystalline semiconductor layer between said pair of impurity regions where said opposed side surfaces extend through said pair of impurity regions and said channel region formed therebetween and include opposing side edges of said channel region extending between said pair of impurity regions;

a gate insulating film formed on at least said channel region; and a gate electrode formed on said gate insulating film, wherein crystallinity of said semiconductor island at said side surfaces of said semiconductor island in at least the entire opposing side edges of said channel region is higher than other portions of said semiconductor island.

12. A device according to claim 11 wherein said substrate is selected from the group consisting of quartz, glass and an insulating film formed on a semiconductor or a conductor.

13. A device according to claim 11 wherein said semiconductor island has a tapered shape.

14. A semiconductor device comprising:

a substrate having an insulating surface;

a crystalline semiconductor island formed on said insulating surface, said island having opposed side surfaces and containing a catalyst metal which is capable of promoting crystallization of silicon at a concentration not higher than $1 \times 10^{19}$ atoms/cm$^3$;

a pair of impurity regions formed in said crystalline semiconductor island;

a channel region formed in said crystalline semiconductor layer between said pair of impurity regions where said opposed side surfaces extend through said pair of impurity regions and said channel region formed therebetween and include opposing side edges of said channel region extending between said pair of impurity regions;

a gate insulating film formed on at least said channel region; and a gate electrode formed on said gate insulating film, wherein crystallinity of said semiconductor island at least said side surfaces of said semiconductor island in at least the entire opposing side edges of said channel region is higher than in other portions of said semiconductor island.

15. A device according to claim 14 wherein said substrate is selected from the group consisting of quartz, glass and an insulating film formed on a semiconductor or a conductor.

16. A device according to claim 14 wherein said semiconductor island has a tapered shape.

17. A semiconductor device comprising:

a substrate having an insulating surface;

a crystalline semiconductor island formed on said insulating surface, said island having opposed side surfaces having a tapered configuration;

a pair of impurity regions formed in said crystalline semiconductor island;

a channel region formed in said crystalline semiconductor layer between said pair of impurity regions where said opposed side surfaces extend through said pair of impurity regions and said channel region formed therebetween and include opposing side edges of said channel region extending between said pair of impurity regions;

a gate insulating film formed on at least said channel region; and a gate electrode formed on said gate insulating film, wherein crystallinity of said semiconductor island at least said side surfaces of said semiconductor island in at least the entire opposing side edges of said channel region is higher than in other portions of said semiconductor island.

18. A device according to claim 17 wherein said substrate is selected form the group consisting of quartz, glass and an insulating film formed on a semiconductor or a conductor.

19. A device according to claim 17 wherein said semiconductor island has a tapered shape.

20. The semiconductor device of claim 17 wherein said gate electrode is provided with an anodic oxide film on at least side surfaces of said gate electrode.

* * * * *